United States Patent [19]

Katzmann et al.

[11] 4,090,632
[45] May 23, 1978

[54] ADJUSTABLE INSTRUMENT CASE

[75] Inventors: Fred L. Katzmann, Cedar Grove, N.J.; Dale W. Gruye, Portola Valley, Calif.

[73] Assignee: Ballantine Laboratories, Inc., Boonton, N.J.

[21] Appl. No.: 759,670

[22] Filed: Jan. 17, 1977

[51] Int. Cl.² .......................... B65D 7/00; H02K 5/04
[52] U.S. Cl. ..................................... 220/4 R; 220/76; 174/52 R
[58] Field of Search ............. 220/4 A, 4 R, 4 F, 4 C, 220/8, 76; 361/331, 380, 390; 312/244, 264; 174/52 R

[56] References Cited

U.S. PATENT DOCUMENTS

| | | | |
|---|---|---|---|
| 2,386,297 | 11/1945 | Slaughter | 154/42 |
| 3,639,809 | 2/1972 | Phlieger, Jr. | 220/5 R X |

OTHER PUBLICATIONS

Electronics, Jun. 24, 1976, pp. 42 & 44, New Case Adjusts to Fit Instrument.
Zero Manufacturing Co., 1975, Zero VIP Compact 1 Enclosures.
Tracewell Enclosures, Apr. 1974, Electronic Enclosure.

*Primary Examiner*—William Price
*Assistant Examiner*—Steven M. Pollard
*Attorney, Agent, or Firm*—Davis, Hoxie, Faithful & Hapgood

[57] ABSTRACT

The present invention comprises a plastic case for housing electronic instruments and the like, having a top and bottom panel with two side panels connecting them. The edges of the top and bottom panels are mounted for telescoping movement in the side panels to enable adjustment of the case to the size of instrument housed.

23 Claims, 6 Drawing Figures

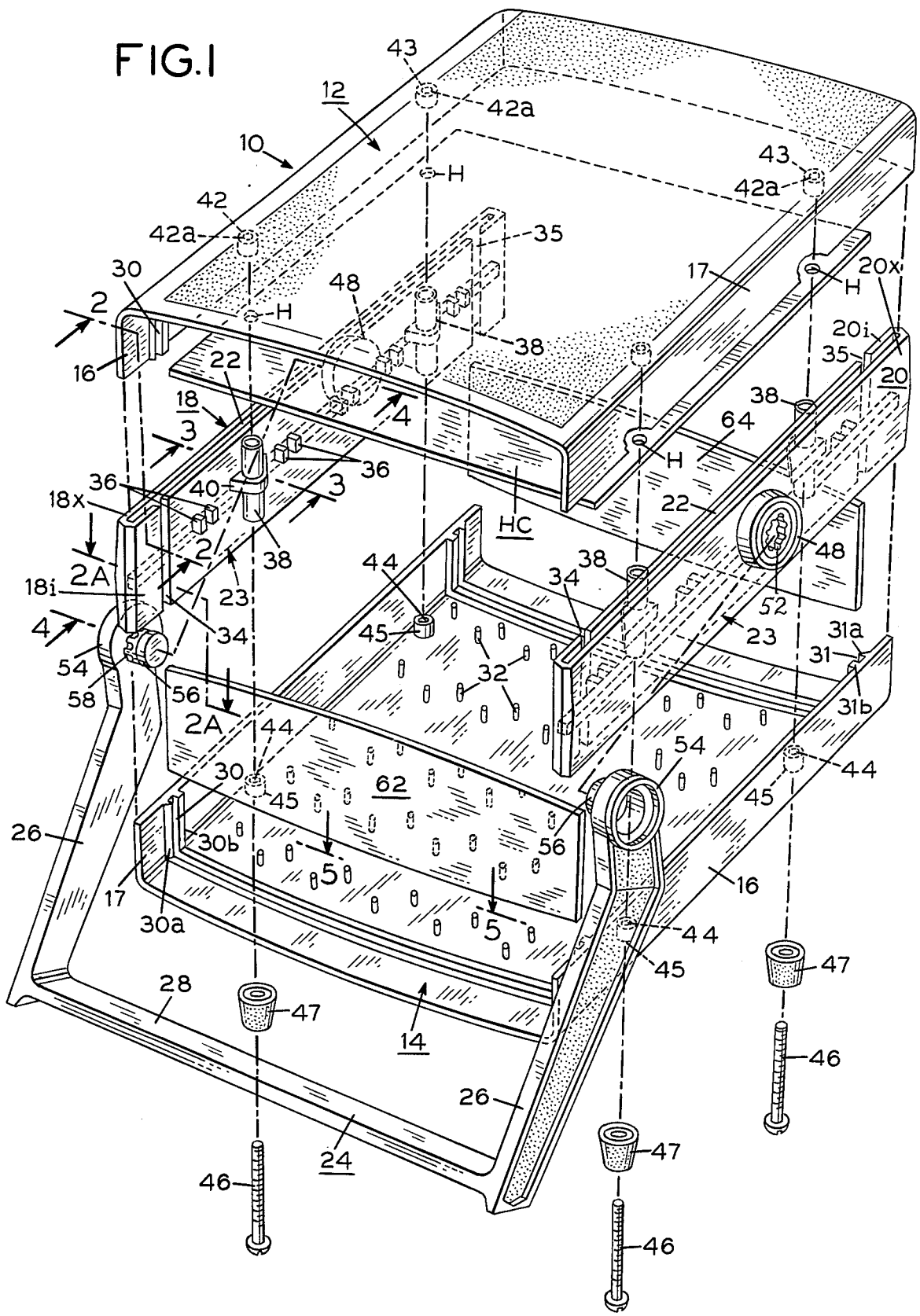

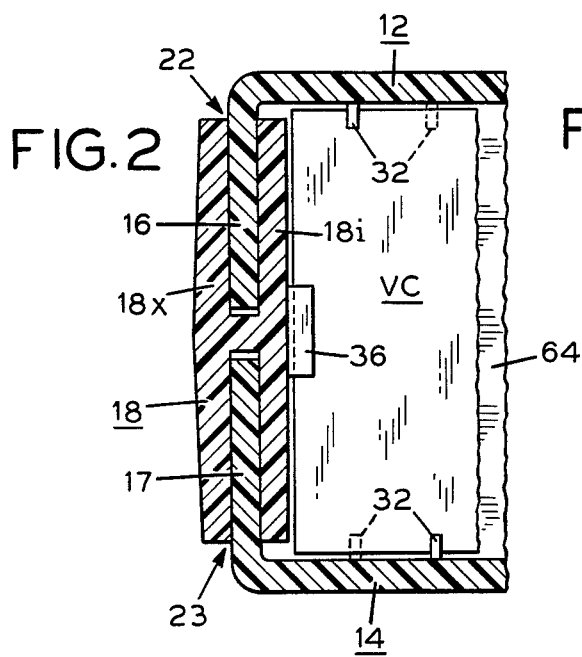
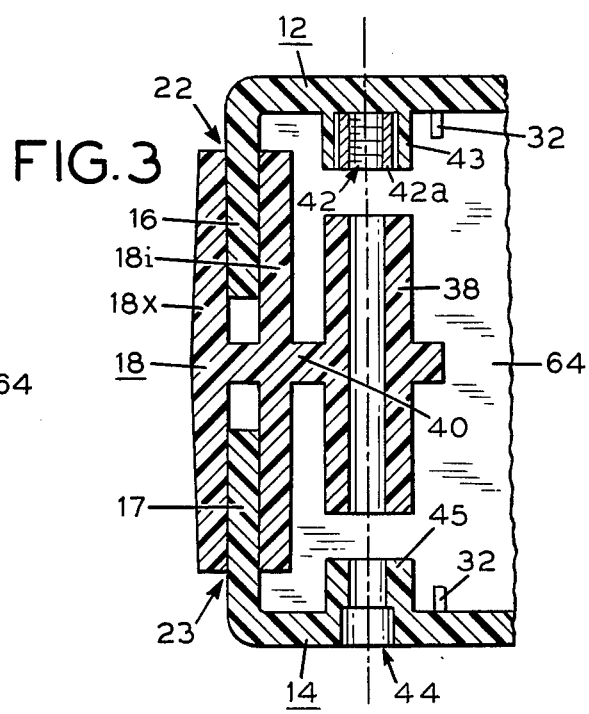
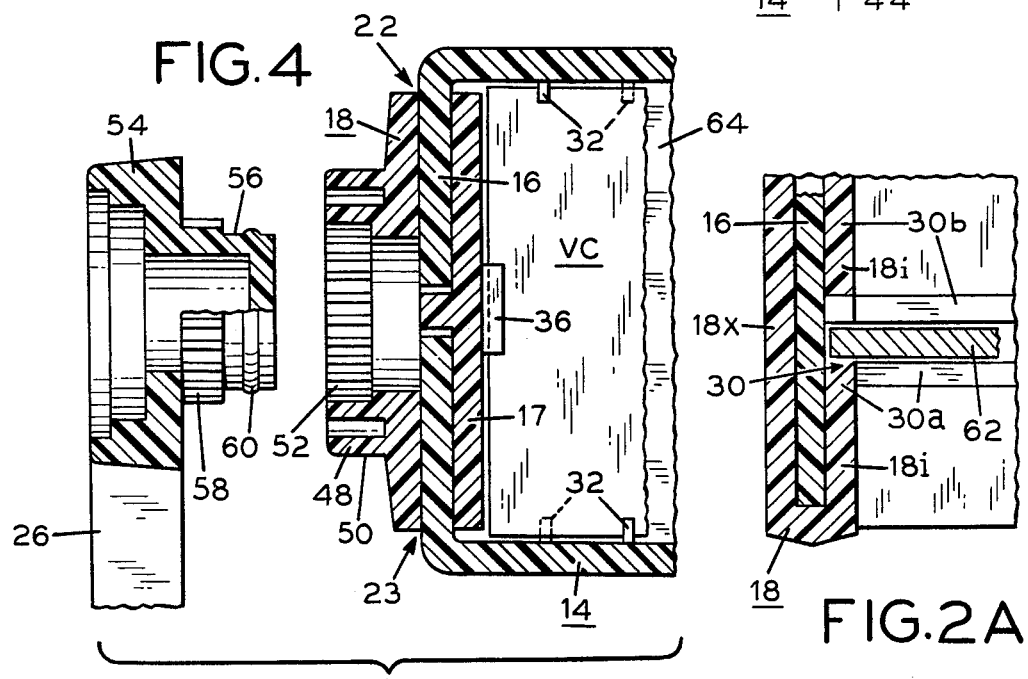
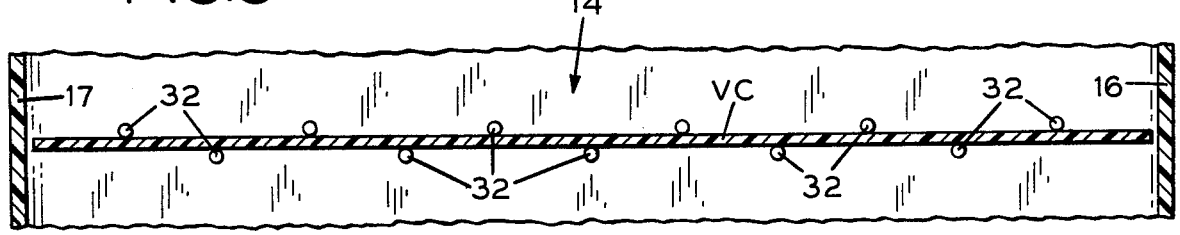

ADJUSTABLE INSTRUMENT CASE

The present invention relates to an instrument case, and, more particularly, to a plastic instrument case capable of adjustment to the size of instrument it houses.

An instrument case protects the device housed and its user, improves appearance and may perform other related functions. Most electronic instruments and the like include a front panel which forms a part of the enclosure. Some also include a back panel which forms a part of the enclosure. There are many different basic forms of cases which are used to enclose the remaining sides of instruments. The simplest is the one-piece shell, usually a five-sided rectangular plastic or metal box. In some instances, one-piece shell cases enclose only four sides or a small opening is provided in the back for a fuse panel or the like.

The two-piece instrument case is now quite common. One piece usually forms the top and the upper portion of the sides while the other piece forms the bottom and the remainder of the sides. A step beyond the two-piece case is the four-piece case in which an insert joins the top and bottom pieces on each side. In some instances, the inserts form a major portion of the side walls. There are also, of course, four-piece cases in which the top, bottom and sides are each separate pieces.

Each of these common one-piece, two-piece and four-piece cases is designed for a single size of instrument and substitution or addition of pieces is required to use the case with more than one type of instrument.

It is an object of the present invention to provide a plastic instrument case that can adjust to the height of instrument it houses. It is also an object of the invention to reduce the need to stock various sizes of case parts to enclose a range of instruments of various heights.

In accordance with this and other objects of the invention, the instrument case of the present invention comprises a flanged top panel, a flanged bottom panel and a pair of side panels. The flanges of the top and bottom panels fit into channels in the side panels, permitting telescopic adjustment of the case height.

The present invention will be better understood from the following detailed description and the drawings, in which like numerals refer to like parts throughout, wherein:

FIG. 1 is an exploded isometric view of a case according to one embodiment of the present invention.

FIG. 2 is a sectional view of an assembled case taken generally along line 2—2 of a side panel at the location indicated in FIG. 1.

FIG. 2A is a sectional view of an assembled case taken generally along line 2A—2A of a side panel at the location indicated in FIG. 1.

FIG. 3 is a sectional view of an assembled case taken generally along lines 3—3 of a side panel at the location indicated in FIG. 1.

FIG. 4 is a sectional view of a handle and a side panel taken generally along line 4—4 of FIG. 1.

FIG. 5 is a plan view taken generally at line 5—5 of FIG. 1.

DETAILED DESCRIPTION OF THE INVENTION

FIG. 1 shows an exploded view of an instrument case 10 according to one embodiment of the present invention. The case includes two panels: a top panel 12 and a bottom panel 14 which are made with the same basic molds and are the same in most respects. Each includes two depending flanges 16 and 17 at its opposite margins. Two identical mutually parallel side panels 18 and 20 comprise members each having elongated channels 22 and 23 in their edges. The flanges 16 and 17 fit into the channels 22 and 23, respectively, to mount the top panel 12 and the bottom panel 14 to the side panels. A U-shaped handle 24 has two legs 26 and a cross-bar 28 connecting them. The ends of the legs 26 pivotally mount to the side panels 18 and 20. The top, bottom and side panels are molded from a suitable plastic such as Cycolac brand ABS or a similar product. The handle is molded from Lexan brand polycarbonate or a similar product.

The top panel 12 and the bottom panel 14 each include two grooves 30 and 31 on their interior surface. On each panel, one of the grooves 30 is proximate to the unflanged front margin and the other groove 31 is proximate to the unflanged rear margin. (The groove 31 at the rear of the top panel 12 is omitted from FIG. 1 for clarity.) The grooves 30 and 31 are formed integrally with the panels 12 and 14 by protrusions such as ridges 30a and 30b (forming groove 30) and ridges 31a and 31b (forming groove 31), raised from the panel surface. The top panel 12 and the bottom panel 14 also include a plurality of nibs 32 formed integrally on the interior surfaces of the panels. (The nibs 32 on the interior of the top panel 12 are omitted from FIG. 1 for clarity.) The top and bottom panels 12 and 14 may be the same molded part and differ only in the finishing details such as the threaded inserts 42a in the fastener bosses 43 of the top panel 12 or the holes 44 in the bosses fastener 45 of the bottom panel 14, as described below.

The side panels or members 18 and 20 each have an H-shaped cross-section, as best seen in FIG. 2. The sides of the H form interior walls 18i and 20i and exterior walls 18x and 20x of the side panels. These interior and exterior walls are spaced apart by slightly more than the thickness of the depending flanges 16 and 17 of the top and bottom panels 12 and 14, forming the channels 22 and 23. The side panels 18 and 20 have two slots 34 and 35 in their interior walls. One of the slots 34 is proximate to the front end of the side panel and the other slot 35 is proximate to the rear end. The slots 34 and 35 accept the raised ridges 30a, 30b, 31a and 31b of top and bottom panels 12 and 14, as best seen in FIG. 2A. Each side panel also includes a plurality of paired tabs 36 extending into the interior of the case for the mounting of circuit boards as described below. (See FIG. 1, showing tabs 36 on side panel 18. The tabs 36 on side panel 20 are omitted from FIG. 1 for clarity.)

Four assembly means, one of which is shown in section in FIG. 3, help to secure the top and bottom panels together. Each assembly means includes a fastener guide means or tube 38 secured to or formed integrally with a bracket 40 that in turn is secured to or formed integrally with a side panel 18 or 20. The assembly means also includes a blind hole 42 in a top panel fastener boss 43 in the interior of the top panel 12, which has a threaded brass insert 42a or other panel fastening means secured in it, and a panel hole 44 *through a bottom panel fastener boss 45 in the bottom panel 14.* The centerlines of the holes 42 and 44 and fastener guide means hole through the tube 38 generally coincide. Each of four threaded bolts 46 (see FIG. 1) or other elongate fastener extends through a foot 47, the panel hole 44 and the fastener guide means or tube 38 and screws into the insert or panel fastening means 42a. The head of the bolt 46 is hidden from sight within the foot 47. The fastener guide means or tubes 38 attached to the side panel 18 or 20 greatly simplify the task of engaging the bolt 46 to the insert 42a.
hidden from sight within the foot 47. The fastener guide means or tubes 38 attached to the side panel 18 or 20 greatly simplify the task of engaging the bolt 46 to the insert 42a.

When the closest possible spacing of the top and bottom panels 12 and 14 is employed, their relative position may be determined by the height of panel fastener bosses 43 and 45, and the height of the tube 38; by the height of the inner walls 18x and 20x of the side panels; or by the height of the instrument's front and rear panels 62 and 64 fitting in grooves 30 and 31. At greater spacings of the top and bottom panels, it is preferable to provide appropriate spacers (not shown) between the tube 38 and the fastener bosses 43 and 45.

The handle 24 pivotally mounts to the side panels or members 18 and 20. The pivot structure is shown in detail, and in section, in FIG. 4. Each side panel 18 and 20 has a female handle boss 48 formed integrally into its outside surface. The outer portion 50 of the female boss 48 is smooth, while the inner portion 52 is serrated. Each leg 26 of the handle has an integral male handle boss 54 at its end. The male boss 54 has a smooth outer portion 56 and a serrated outer portion 58. The smooth outer portion 56 of the male boss 54 has an integral collar 60. The cross-bar 28 of the handle 24 can deform slightly and resume its original shape. The handle 24 is mounted to the case 10 by spreading the legs 26 apart far enough to permit the male bosses 54 to clear the outer ends of the female bosses 48. When the male bosses are aligned with the female bosses, the cross-bar 28 is allowed to force the handle back toward its undeformed shape and the male bosses enter the female bosses. The collar 60 forms a close tolerance fit with smooth portion 50 of the female boss. The serrated portions 52 and 58 cooperate to form a keying means to prevent undesired movement of the handle. To rotate the handle, the cross-bar 28 is deformed so that the serrated portions disengage, but the smooth portions remain engaged. The collar 60 inhibits relative axial movement of the bosses.

An instrument is installed in the case 10 as follows. The handle 24 is pivoted out of the way or removed. The top or bottom panel 12 or 14 is removed. The instrument typically will have front and back panels or end plates 62 and 64 that fit into the grooves 30 and 31. Alternatively, blank front and back panels or end plates 62 and 64 can be used to close off the case. Either the top or bottom panel may include suitable interior brackets or bosses (not shown) to which the instrument or portions thereof can be secured. The instrument may be organized in various ways within the case, for example, by supporting circuit boards from the front and rear panels 12 and 14, by supporting vertically mounted circuit boards VC in nibs 32 and paired tabs 26 (See FIG. 5), or by supporting a horizontally mounted circuit boards HC, between tube 38 and boss 43 on boss 45 to be secured by the bolts 46 through holes H in the circuit board. The case 10 also has a great degree of flexibility in the size and kind of apparatus it can house. For example, it can provide a tapered housing for instruments, because the top and bottom panels 12 and 14 can be arranged in diverging planes.

When the instrument is within the case, the top and bottom panels are urged together and bolts 46, of a length suitable for the particular instrument housed, are passed through the holes 44 and the tubes 38, and are screwed tightly into threaded inserts 42a. The handle 24 can be locked into a position suitable for carrying the instrument or into a position that permits the case to be propped into an inclined position on a flat surface.

Another feature of the case is the structure of the female handle bosses 48, which extend only partially through the side panels. They do not extend into the interior of the case. When a conductive coating is applied to the interior of the case 10, there is much less chance of RF leakage than in some cases in which the handle structure presents an opening through the case wall. The structure of the handle bosses 48 also aid in protecting the instrument within the case from the elements.

Throughout the preceeding description the words "top," "bottom," "sides," "front" and "back" have been used in a relative, not an absolute, sense to make clear the interrelationships between the parts of the described embodiment.

Only one embodiment of the present invention has been described in detail, those skilled in the art will recognize that other embodiments, and modifications to the disclosed embodiment, are within the present invention, the scope of which is defined only by the following claims.

We claim:

1. An electrical instrument case, adjustable in one of its dimensions, comprising a pair of panels each having a pair of flanges at opposite margins of the panel with each of the flanges of a panel projecting to the same side of the panel and toward the flanges of the other panel, and a pair of members each having an inner wall and an outer wall which are spaced by the thickness of a flange of a panel to form an elongated channel to adjustably and telescopically receive a flange of each panel.

2. An electrical instrument case in accordance with claim 1 further comprising a plurality of assembly means each comprising an elongate fastener, a hole through one panel, panel fastening means attached to the other panel and fastener guide means having a hole therein secured to a member, wherein the panel hole, panel fastening means and fastener guide means hole are generally axially aligned and the elongate fastener passes through the panel hole and fastener guide means hole and engages the panel fastening means.

3. An electrical instrument case in accordance with claim 2 wherein the fastener guide means is a tube secured to the member by a bracket.

4. An electrical instrument case in accordance with claim 2 further comprising an endplate extending between the pair of panels and the pair of members, a pair of protrusions on each of the flanges, and a slot in the wall of the channel of each member, wherein the protrusions are spaced by the thickness of the endplate, the endplate is received in the space between the protrusions, and each slot receives a pair of protrusions.

5. An electrical instrument case in accordance with claim 4, wherein each protrusion forms a ridge extending along the panel near an unflanged margin of the panel from one flange to the other flange.

6. An electrical instrument case in accordance with claim 2 further comprising a pair of endplates each extending between the pair of panels and the pair of members near an unflanged margin of the panels, two ridge pairs on each of the flanges each of which ridge pairs extends along the panel near an unflanged margin to form a groove extending from one flange to the other flange, the ridges of each pair being spaced by the thickness of an endplate and receiving an endplate in the groove formed between them, and slots in a wall of the channel of each member, each slot being aligned with and receiving a pair of ridges.

7. An electrical instrument case in accordance with claim 6 wherein the fastener guide means is a tube secured to the member by a bracket.

8. An electrical instrument case in accordance with claim 1 wherein each of the members has an H-shaped cross-section with the inner wall and the outer wall each forming one side of the H.

9. An electrical instrument case in accordance with claim 8 further comprising a plurality of assembly means each comprising an elongate fastener, a hole through one panel, panel fastening means attached to the other panel and fastener guide means having a hole therein secured to a member, wherein the panel hole, panel fastening means and fastener guide means hole are generally axially aligned and the elongate fastener passes through the panel hole and fastener guide means hole and engages the panel fastening means.

10. An electrical instrument case in accordance with claim 9 wherein the fastener guide means is a tube secured to the member by a bracket.

11. An electrical instrument case in accordance with claim 9 further comprising an endplate extending between the pair of panels and the pair of members, a pair of protrusions on each of the flanges, and a slot in the wall of the channel of each member, wherein the protrusions are spaced by the thickness of the endplate, the endplate is received in the space between the protrusions, and each slot receives a pair of protrusions.

12. An electrical instrument case in accordance with claim 11, wherein each protrusion forms a ridge extending along the panel near an unflanged margin from one flange to the other flange.

13. An electrical instrument case in accordance with claim 9 further comprising a pair of endplates each extending between the pair of panels and the pair of members near an unflanged margin of the panels, two ridge pairs on each of the flanges each of which ridge pairs extends along near an un-flanged margin of the panel to form a groove extending from one flange to the other flange, the ridges of each pair being spaced by the thickness of an endplate and receiving an endplate in a groove between them, and slots in the walls of the channel of each member, each slot being aligned with and receiving a pair or ridges.

14. An electrical instrument case in accordance with claim 13 wherein the fastener guide means is a tube secured to the member by a bracket.

15. An electrical instrument case in accordance with claim 8 further comprising an endplate extending between the pair of panels and the pair of members, a pair of protrusions on each of the flanges, and a slot in the wall of the channel of each member, wherein the protrusions are spaced by the thickness of the endplate, the endplate is received in the space between the protrusions, and each slot receives a pair of protrusions.

16. An electrical instrument case in accordance with claim 15, wherein each protrusion on each forms a ridge extending along the panel near an unflanged margin from one flange to the other flange.

17. An electrical instrument case in accordance with claim 1 further comprising an endplate extending between the pair of panels and the pair of members, a pair of protrusions on each of the flanges, and a slot in the wall of the channel of each member, wherein the protrusions are spaced by the thickness of the endplate, the endplate is received in the space between the protrusions, and each slot receives a pair of protrusions.

18. An electrical instrument case in accordance with claim 17, wherein each of protrusion forms a ridge extending along the panel near an unflanged margin from one flange to the other flange.

19. An electrical instrument case in accordance with claim 1 further comprising a pair of endplates each extending between the pair of panels and the pair of members near an unflanged margin of the panels, two ridge pairs on each of the flanges each of which ridge pairs extends along the panel near an unflanged margin forming a groove extending from one flange to the other flange, the ridges of each pair being spaced by the thickness of an endplate and receiving an endplate between them, and slots in the wall of the channel of each member, each slot being aligned with and receiving a pair of ridges.

20. An electrical instrument case in accordance with claim 19 wherein the fastener guide means is a tube secured to the member by a bracket.

21. An electrical instrument case in accordance with claim 1 further comprising a protrusion on the inner surface of each of the flanges and a slot in a wall of the channel of each member, the slot receiving a protrusion on a flange.

22. An electrical instrument case in accordance with claim 1 further comprising a ridge on the inner surface of each of the flanges and a slot in the wall of the channel of each member, each slot receiving a ridge on a flange.

23. An electrical instrument case in accordance with claim 22 wherein a ridge on each flange extends along on the inner surface of each panel near an unflanged margin of the panel and joins a ridge on the other flange of the panel.

* * * * *